United States Patent [19]
Heimlicher

[11] Patent Number: 4,509,023
[45] Date of Patent: Apr. 2, 1985

[54] OSCILLATOR WITH A TEMPERATURE COMPENSATED OSCILLATING COIL

[75] Inventor: Peter Heimlicher, Freiburg, Switzerland

[73] Assignees: Contrinex S.A., Matran, Switzerland; Siemens Aktiengesellschaft, Munich, Fed. Rep. of Germany; a part interest

[21] Appl. No.: 393,629

[22] Filed: Jun. 30, 1982

[30] Foreign Application Priority Data

Jul. 17, 1981 [CH] Switzerland ............... 4702/81

[51] Int. Cl.$^3$ ................................ H03L 1/02
[52] U.S. Cl. ..................... 331/176; 331/66; 331/167
[58] Field of Search ............ 331/66, 167, 176

[56] References Cited

U.S. PATENT DOCUMENTS 3,296,553  1/1967  Reid ............................. 331/176
4,241,317  12/1980  Breitling ..................... 331/167 X

FOREIGN PATENT DOCUMENTS 1589826  5/1970  Fed. Rep. of Germany.

OTHER PUBLICATIONS

Elektronik, Band 19, Nr. 3, Mar. 1970.
Electronic Technology, Band 39, Nr. 9, Sep. 1962.

*Primary Examiner*—Eugene R. LaRoche
*Assistant Examiner*—Robert J. Pascal
*Attorney, Agent, or Firm*—Wender Murase & White

[57] ABSTRACT

A method of using the temperature coefficient of the copper resistance of an oscillating coil to compensate for the temperature coefficient of the quality factor of the same oscillating coil. To this end, a voltage proportional to the copper resistance of the oscillating coil is generated across the oscillating circuit. The oscillator according to the process comprises an oscillating coil which comprises a high frequency litz wire. In order to access the copper resistance of the coil one of the litz wires is separated from the other wire at a first terminal of the coil and separately connected to a second terminal of this coil. From this second terminal, the coil is seen as a bifilar coil. A constant alternating current source is connected to the second terminal in order to generates across the oscillating circuit a voltage proportional to the copper resistance of the coil. The oscillator is preferably used for proximity switches having relatively large switching distance.

8 Claims, 7 Drawing Figures

OSCILLATOR WITH A TEMPERATURE COMPENSATED OSCILLATING COIL

FIELD OF THE INVENTION

The present invention relates to a process for compensation of the temperature behaviour of an oscillating circuit and to a temperature compensated oscillator according to said process.

BACKGROUND OF THE INVENTION

Oscillators comprising a LC-oscillating circuit are used e.g. for proximity switches in which the approach of a driving blade produces a damping of the oscillating output signal of the oscillator. The amplitude of the output signal of the oscillator decreases and drives, e.g. a level detector, which delivers a useful output signal from the proximity switch.

The principal disadvantage of conventional inductive proximity switches is their relatively limited switching distance. An increase in the switchihg distance is hindered by the temperature dependence of the combination of the oscillator circuit, and the oscillating circuit, which with an increasing switching distance gives rise to a normally unacceptable temperature coefficient proportional to switching distance.

FIG. 1a shows a behaviour of the relative quality factor Q/Qo of an oscillating circuit as a function of the distance d (switching distance) of the driving blade of an inductive proximity switch. It may be seen that with an increasing switching distance d, the useful change of the relative quality factor Q/Qo of the oscillating circuit sinks rapidly to a very small value. If the normal working range is such that for a given switching distance the relative quality factor has a predetermined value of 50%, the curve of FIG. 1a shows that the relative quality factor drops to about 3% if the switching distance is increased three times.

The influence of the ambient temperature upon the relative quality factor of the oscillating circuit is indicated in FIG. 1b which shows that the ratio Q/Qo decreases with increasing temperature. A comparison with FIG. 1a indicates that for greater switching distances, the influence of temperature upon Q/Qo rapidly becomes more important than the change resulting from switching distance of the driving blade.

It is therefore an object of the present invention to provide a process capable of greatly reducing the temperature dependence of the oscillating circuit so that proximity switches having a switching distance several times greater than the conventional ones may be used.

SUMMARY OF THE INVENTION

In the process according to the present invention the temperature coefficient of the copper resistance of the oscillating coil is used for compensating the temperature coefficient of the quality factor of the oscillating circuit, said compensation being provided by the injection of a voltage proportional to said copper resistance of the oscillating coil into said oscillating circuit.

This produces a nearly ideal temperature compensation, even when gradients of temperature are present within the circuit which are contrary to effects obtained by using compensating elements connected external to the oscillating coil.

It is a further object of the present invention to provide an apparatus for realizing a temperature compensated oscillator.

The oscillator according to the present invention comprises a temperature compensated oscillating coil in accordance with the aforementioned process, this coil being connected in parallel with a negative resistance.

The invention will be described further by way of example with reference to the accompanying drawings.

DESCRIPTION OF THE PREFERRED EMBODIMENT

Figure 1A:
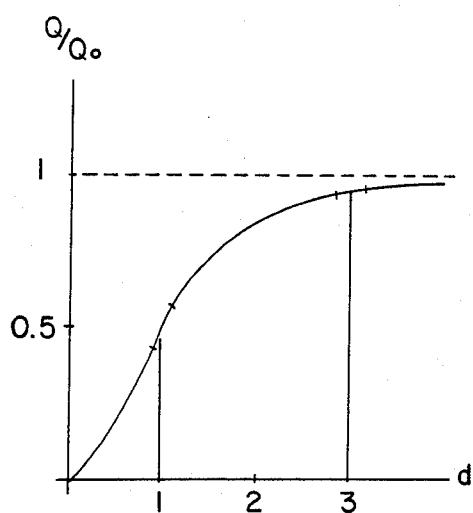
FIG. 1a is a graph illustrating the behaviour of the relative quality factor Q/Qo of an oscillating coil of an inductive proximity switch as a function of the switching distance.
Figure 1B:
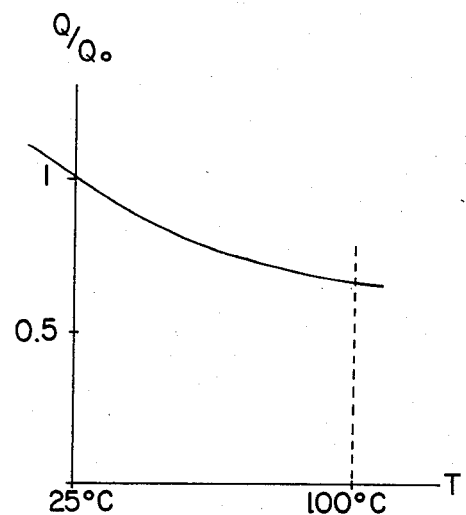
FIG. 1b is a graph illustrating the behaviour of the relative quality factor Q/Qo of an oscillating coil of an inductive proximity switch as a function of temperature.
Figure 2:
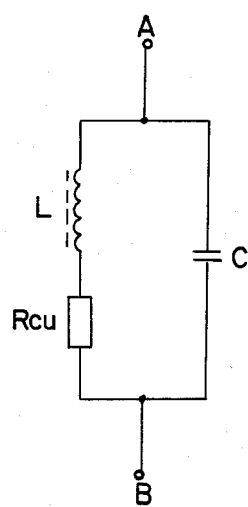
FIG. 2 is a schematic diagram illustrating an equivalent circuit of a LC-oscillating circuit.

An analysis of the oscillating circuit according to FIG. 2 shows that the quality factor of this circuit is determined principally by the copper resistance of the oscillating coil L when taking into consideration the materials and frequencies which are normally used for a proximity switch. The relation giving the quality factor of such a circuit is as follows when other losses are neglected:

$$Q = \sqrt{\frac{C}{L}} \cdot \frac{\frac{L}{C} + R_{cu}^2}{R_{cu}} \quad (1)$$

and, as a rule:

$$\frac{L}{C} >> R_{cu}^2, \text{ so that: } Q = \sqrt{\frac{L}{C}} \cdot \frac{1}{R_{cu}} \quad (2)$$

For a given oscillating coil, the quality factor Q, and also the temperature coefficient of Q, are therefore inversely proportional to the copper resistance $R_{cu}$. For example, if the temperature coefficient of this copper resistance has a value of about $+0.004/°K$. between 0° and 100° C., the temperature coefficient of Q has a relatively high value of about $-0.4\%/°K$.

In order to eliminate this influence of temperature and according to the process an apparatus of the present invention, the copper resistance $R_{cu}$ of the oscillating coil, is used for compensating the temperature coefficient of the quality factor of the oscillating coil. This produces, in accordance with the above relation (2) a nearly ideal compensation even when gradients of temperature are present within the circuit itself.

Figure 3A:
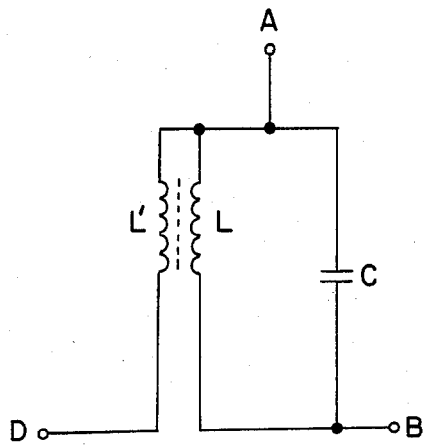
FIG. 3a is a schematic diagram illustrating an diagram of a LC-oscillating circuit having a bifilar coil.
Figure 3B:
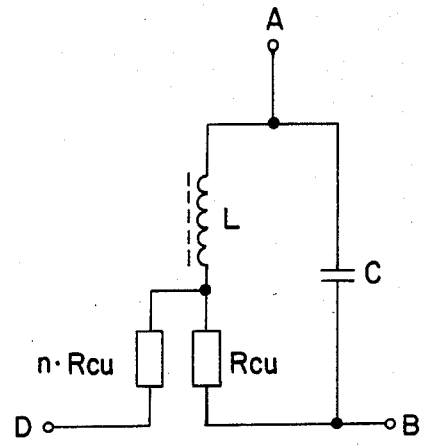
FIG. 3b shows the equivalent circuit of the oscillating coil of FIG. 3a, FIG. 4 is a schematic diagram indicating the principle of an oscillator according to the invention.

FIGS. 3a and 3b illustrates how the copper resistance $R_{cu}$ of the coil L, may be accessed in a very simple manner. The coil L which is connected between the terminals A and B, is realized in a known manner using a high frequency litz wire. If e.g. at terminal B one of the litz wires is separated from the other wire and connected separately to a terminal D, the coil, as seen between the terminals B and D to which it is connected, presents itself as a bifilar coil. Due to the bifilar winding of the coil, the combined effect of the inductances L and L' cancels out and the connection D permits an access to the copper resistance $R_{cu}$ of the coil L as indicated in FIG. 3b.

Figure 4:
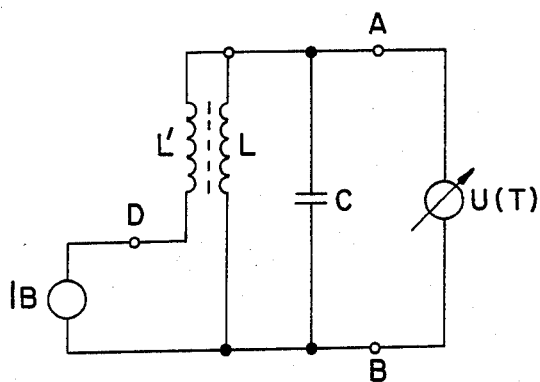

If as shown in FIG. 4, a constant alternating current source $I_B$ having a frequency $f_{res}$, identical to the resonance frequency of the LC-oscillating circuit, is connected between terminals B and D, the oscillating circuit is set into oscillation and it oscillates at its frequency of resonance. The voltage $V_B$ injected in the oscillating circuit is given by:

$$U_B = I_B \cdot R_{cu} \tag{3}$$

Hence, this injected or coupled voltage is proportional to the copper resistance $R_{cu}$ of the coil so that it increases when the temperature rises and vice versa. It has been shown previously that the quality factor Q of the oscillating coil varies inversely to the copper resistance $R_{cu}$ so that it becomes smaller when the temperature rises and vice versa. If the quality factor decreases, the voltage U(T) across the oscillating circuit also decreases and vice versa. If the temperature rises, the decrease of the voltage U(T) across the oscillating circuit is compensated for by the increase of the voltage $U_B$ across the copper resistance $R_{cu}$ of the coil L, and an increase of the voltage U(T) across the oscillating circuit is compensated by a decrease in the voltage $U_B$ across the copper resistance of the oscillating coil. Due to the opposite temperature coefficient of the quality factor Q (relation 2), the voltage U(T) measured between the terminals A and B of the oscillating circuit is independent of temperature and it has, with respect to $U_B$, a lag of 90°.

Figure 5:
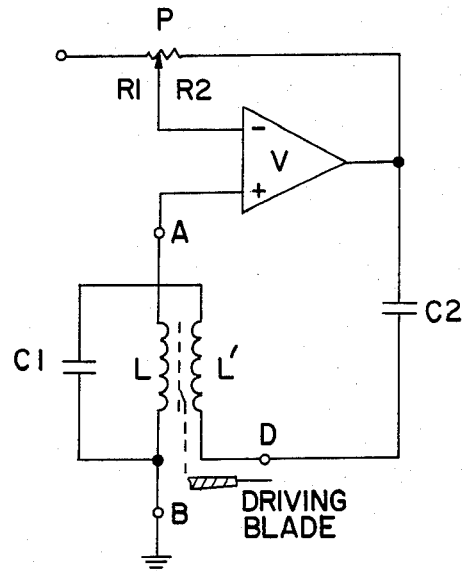
FIG. 5 is a schematic diagram diagram of an oscillator according to a preferred embodiment of the present invention.

The oscillator illustrated in FIG. 5 comprises an operational amplifier V the inverting input of which is connected with the slider of a potentiometer P. The potentiometer P is connected between a pole or terminal of a voltage supply source and the output of the amplifier V and it provides an adjustable feedback for this amplifier. The non inverting input of the amplifier is connected to the LC-oscillating circuit at terminal A and the separated connection of the coil L', which is connected separately to the terminal D, is connected to the output of the amplifier through a capacitor C2. The circuit is such that the oscillating circuit L,C1 sees at point A a negative resistance and it is set into oscillation provided this negative resistance is smaller than the impedance of the oscillating circuit. The value of the negative resistance and hence the self-oscillation point of the oscillator may be adjusted by the potentiometer P. The capacitor C2 must have a relatively small capacitance value providing a relatively high impedance in order to transform the output voltage of the amplifier V into a constant current feeding the coil at point D and also for providing the required phase shift of 90°. A driving blade passing in front of the coil L changes the self-oscillation point of the oscillator in contrast to conventional proximity switches in which the approach of the driving blade changes the amplitude of the output signal of the oscillator. It is sufficient for the following detecting circuit (not shown), to detect in a known manner, the set in or the set out of the oscillator and to amplify this signal. FIG. 5 shows that the oscillator proximity switch may be realized by a very simple circuit. With the proximity switch according to the invention, the switching distance is increased about three times as compared with the conventional proximity switches. The proximity switch works perfectly even at greater switching distances.

I claim:

1. A method of compensating for temperature variations in the amplitude of a voltage across an oscillating circuit, said oscillating circuit including an oscillating coil having a temperature dependent copper resistance, comprising the steps of:

delivering a constant alternating current to said oscillating coil to set said oscillating circuit into oscillation wherein a temperature dependent voltage drop is developed across the copper resistance of said oscillating coil, said voltage drop being directly proportional to said temperature dependent copper resistance;

and using said voltage drop to compensate for any temperature dependent amplitude variation in the voltage across said oscillating circuit.

2. A method according to claim 1, further comprising the step of:

using a stranded wire wound oscillating coil, said coil having at least one strand separated from other strands at one end thereof whereby said coil, as seen between said separated strand and said one end, comprises a bifilar coil providing access to said copper resistance.

3. A method according to claim 2, wherein said oscillating circuit has a resonant frequency and said step of delivering further comprises delivering said alternating current at said resonant frequency.

4. A temperature compensated oscillator comprising:

an oscillating circuit including an oscillating coil having a temperature dependent copper resistance, said oscillating circuit having a resonant frequency;

a negative resistance connected across said oscillating circuit;

a constant alternating current source for supplying current at said resonant frequency to said oscillating circuit, said constant alternating current producing across the copper resistance a temperature dependent voltage drop proportional to said temperature dependent resistance wherein said voltage drop compensates for any temperature induced variation in amplitude of a voltage across said oscillating circuit.

5. The oscillator according to claim 4, wherein said oscillating coil comprises a stranded wire wound coil, said oscillator having first, second and third terminals wherein said coil is connected between said first and second terminals, at least one of the wire strands being separated from the other strands at said second terminal and connected to sad third terminal, said constant alternating current source being connected between said third and said second terminals and said temperature dependent voltage drop being present across the first terminal.

6. The oscillator according to claim 5, wherein said oscillating circuit comprises a capacitor connected across said oscillating coil, and said temperature compensated oscillator further comprising an amplifier having an inverting and a non-inverting input and an output, and a potentiometer having a slider arm, said potentiometer being connected between a common terminal of said oscillator and the output of said amplifier and said slider arm being connected to said inverting input, and wherein said negative resistance is connected to said first terminal and comprises said non-inverting input.

7. The oscillator according to claim 6, further comprising a coupling capacitor connected between said third terminal and said amplifier output and operable to transform a voltage at said amplifier output into said constant, alternating current source.

8. A proximity switch comprising:
an oscillator including an oscillating circuit having an oscillating coil with a temperature dependent resistance, said oscillating circuit having a resonant frequency and a negative resistance connected across said oscillating circuit;
a constant alternating current source for supplying said oscillating circuit with current at said resonant frequency, said constant alternating current producing in the temperature dependent resistance of said oscillating coil a temperature dependent voltage drop effective to compensate for any temperature variation in the amplitude of a voltage across said oscillating circuit;
said proximity switch being responsive to a driving blade for driving said proximity switch according to a switching distance between said driving blade and said oscillating coil, said switching distance determining a switching on and off of said oscillator, and said temperature variation compensation of the voltage across the oscillating circuit providing an increased effective switching distance.

* * * * *